(12) United States Patent
Desireddi et al.

(10) Patent No.: US 9,318,215 B2
(45) Date of Patent: Apr. 19, 2016

(54) SYSTEMS AND METHODS TO UPDATE REFERENCE VOLTAGES OF NON-VOLATILE MEMORY

(71) Applicant: SANDISK TECHNOLOGIES INC., Plano, TX (US)

(72) Inventors: Sateesh Desireddi, Andhra Pradesh (IN); Sachin Krishne Gowda, Hassan (IN); Jayaprakash Naradasi, Bangalore (IN); Anand Venkitachalam, Bangalore (IN); Manuel Antonio D'Abreu, El Dorado Hills, CA (US); Stephen Skala, Fremont, CA (US)

(73) Assignee: SANDISK TECHNOLOGIES INC., Plano, TX (US)

( * ) Notice: Subject to any disclaimer, the term of this patent is extended or adjusted under 35 U.S.C. 154(b) by 71 days.

(21) Appl. No.: 13/860,777

(22) Filed: Apr. 11, 2013

(65) Prior Publication Data

US 2014/0226398 A1    Aug. 14, 2014

Related U.S. Application Data

(60) Provisional application No. 61/764,925, filed on Feb. 14, 2013.

(30) Foreign Application Priority Data

Mar. 4, 2013    (IN) .............................. 928/CHE/2013

(51) Int. Cl.
*G11C 16/34*    (2006.01)
*G11C 16/26*    (2006.01)

(52) U.S. Cl.
CPC ............ *G11C 16/3422* (2013.01); *G11C 16/26* (2013.01); *G11C 16/349* (2013.01); *G11C 16/3427* (2013.01); *G11C 16/3436* (2013.01)

(58) Field of Classification Search
CPC ........... G11C 16/3422; G11C 16/3434; G11C 16/349; G11C 16/343; G11C 16/3496
See application file for complete search history.

(56) References Cited

U.S. PATENT DOCUMENTS 7,738,296 B2 *   6/2010   Lin .......................... 365/185.11
7,903,468 B2     3/2011   Litsyn et al.
(Continued)

OTHER PUBLICATIONS

Kang, Wang et al. "Improving Flash Memory Reliability with Dynamic Thresholds: Signal Processing and Coding Schemes," 2012 7th International ICST Conference on Communications and Networking in China (CHINACOM), Aug. 8-10, 2012, IEEE, pp. 161-166.

(Continued)

*Primary Examiner* — Vanthu Nguyen
(74) *Attorney, Agent, or Firm* — Toler Law Group, PC (57) ABSTRACT

A data storage device includes non-volatile memory and a controller. The controller is configured to read first data from the non-volatile memory. The first data indicates a first count of storage elements of the group that have a first activation status when sensed with a first reference voltage at a first time. The controller is configured to read second data from the non-volatile memory. The second data indicates a second count of storage elements of the group that have the first activation status when sensed with the first reference voltage at a second time. The controller is configured to generate an updated first reference voltage at least partially based on a difference between the first count and the second count and based on one or more parameters corresponding to a distribution of threshold voltages of storage elements at the first time.

23 Claims, 5 Drawing Sheets

(56) References Cited

U.S. PATENT DOCUMENTS

| | | | |
|---|---|---|---|
| 7,941,590 B2 | 5/2011 | Yang et al. | |
| 7,954,037 B2 * | 5/2011 | Lasser et al. | 714/763 |
| 8,125,827 B2 | 2/2012 | Park | |
| 8,164,961 B2 * | 4/2012 | Honma | 365/189.15 |
| 8,576,621 B2 | 11/2013 | Kang | |
| 8,621,266 B2 * | 12/2013 | Kang et al. | 714/6.11 |
| 2008/0092026 A1 | 4/2008 | Brandman et al. | |
| 2008/0106936 A1 | 5/2008 | Yang et al. | |
| 2009/0003073 A1 | 1/2009 | Rizel et al. | |
| 2009/0300465 A1 | 12/2009 | Wu et al. | |
| 2009/0307414 A1 | 12/2009 | Sukegawa et al. | |
| 2009/0310404 A1 * | 12/2009 | Cho | G11C 7/06 365/185.2 |
| 2010/0002506 A1 * | 1/2010 | Cho et al. | 365/185.03 |
| 2010/0064200 A1 * | 3/2010 | Choi et al. | 714/773 |
| 2011/0170349 A1 | 7/2011 | Avraham et al. | |
| 2011/0246859 A1 | 10/2011 | Haratsch et al. | |
| 2012/0075932 A1 * | 3/2012 | Moschiano | G11C 11/5628 365/185.19 |
| 2012/0140560 A1 | 6/2012 | Yang | |
| 2013/0007543 A1 | 1/2013 | Goss et al. | |
| 2013/0219108 A1 * | 8/2013 | Yang | 711/103 |

OTHER PUBLICATIONS

International Search Report and Written Opinion of the International Searching Authority for International Application No. PCT/US2014/010750, mailed May 8, 2014, 8 pages.

Desireddi, Sateesh et al. "Systems and Methods to Update Reference Voltages in Response to Data Retention in Non-Volatile Memory," U.S. Appl. No. 13/771,894, filed Feb. 20, 2013, 29 pages.

Non-Final Office Action mailed Mar. 12, 2015 in U.S. Appl. No. 13/771,894, 27 pages.

Final Office Action mailed Jul. 22, 2015 in U.S. Appl. No. 13/771,894, 36 pages.

International Preliminary Report on Patentability for International Application No. PCT/US2014/10750, issued Jul. 14, 2015, 5 pages.

\* cited by examiner

SYSTEMS AND METHODS TO UPDATE REFERENCE VOLTAGES OF NON-VOLATILE MEMORY

CROSS-REFERENCE TO RELATED APPLICATIONS

The present application claims priority from U.S. Provisional Application No. 61/764,925 filed Feb. 14, 2013, and from Indian Application No. 928/CHE/2013, filed Mar. 4, 2013. The contents of each of these applications are incorporated by reference herein in their entirety.

FIELD OF THE DISCLOSURE

The present disclosure is generally related to updating reference voltages of a non-volatile memory.

BACKGROUND

Non-volatile data storage devices, such as universal serial bus (USB) flash memory devices or removable storage cards, have allowed for increased portability of data and software applications. Flash memory devices can enhance data storage density by storing multiple bits in each flash memory cell. For example, Multi-Level Cell (MLC) flash memory devices can provide increased storage density by storing 3 bits per cell, 4 bits per cell, or more.

Storing multiple bits of information in a single flash memory cell typically includes mapping sequences of bits to states of the flash memory cell. For example, a first sequence of bits "110" may correspond to a first state of a flash memory cell and a second sequence of bits "010" may correspond to a second state of the flash memory cell. After determining that a sequence of bits is to be stored into a particular flash memory cell, the particular flash memory cell may be programmed to a state (e.g., by setting a threshold voltage) that corresponds to the sequence of bits.

Once memory cells in a data storage device have been programmed, data may be read from the memory cells by sensing the programmed state of each memory cell by comparing the cell threshold voltage to one or more reference voltages. However, the sensed programming states can sometimes vary from the written programmed states due to one or more factors, such as wearing due to program erase cycles, data retention and program disturb, read disturb conditions.

SUMMARY

Reference voltages used to read stored data may be updated based on shifts of threshold voltages of storage elements that store the data. A shift of a distribution of threshold voltages associated with storage elements may be estimated based on one or more parameters of the distribution at a first time (e.g., prior to data retention) and based on a change in a count of storage elements that are activated when sensed with a reference voltage at the first time as compared to when sensed with the reference voltage at a later time after data retention. One or more updated reference voltages may be determined based on the shift of the distribution.

DETAILED DESCRIPTION

Figure 1:
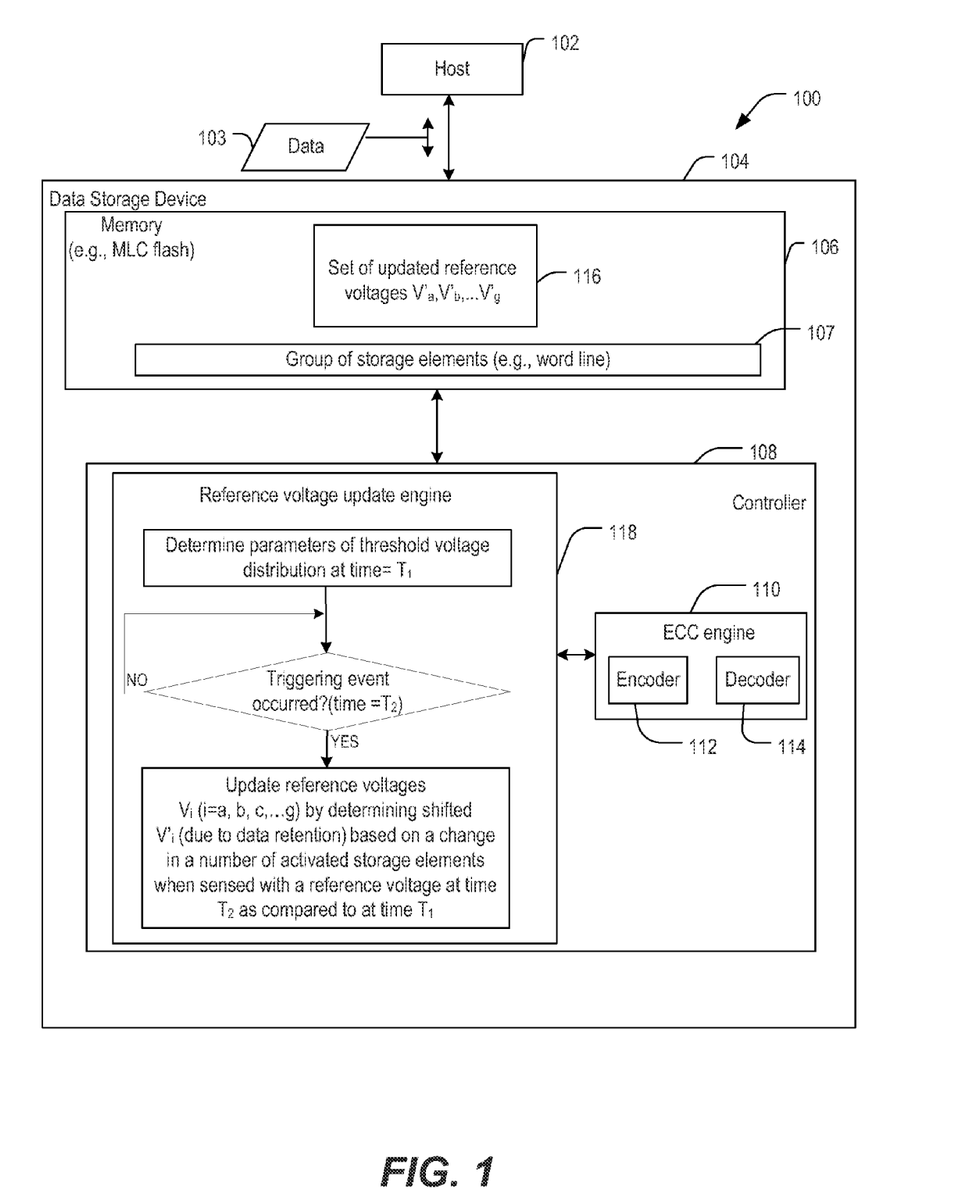
FIG. 1 is a general diagram of an illustrative embodiment of a system including a data storage device including a controller configured to update reference voltages by calculating a shift of threshold voltages.

Referring to FIG. 1, a particular illustrative embodiment of a system 100 includes a data storage device 104 that is configured to update reference voltages. The data storage device 104 includes a memory 106 coupled to a controller 108. The data storage device 104 is configured to enable exchange of data, such as data 103, between a host device 102 and the memory 106 of the data storage device 104.

The host device 102 may be configured to provide data to be stored at the memory 106 or to request data to be read from the memory 106. For example, the host device 102 may include a mobile telephone, a music or video player, a gaming console, an electronic book reader, a personal digital assistant (PDA), a computer such as a laptop computer, a notebook computer, or a tablet, any other electronic device, or any combination thereof.

The data storage device 104 may be a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). As another example, the data storage device 104 may be embedded memory in the host device 102, such as eMMC® (trademark of JEDEC Solid State Technology Association, Arlington, Va.) memory and eSD memory, as illustrative examples.

The memory 106 may be a non-volatile memory of a flash device, such as a NAND flash device, a NOR flash device, or any other type of flash device. The memory 106 may include a group of storage elements 107. For example, the group of storage elements 107 may include a word line. Each storage element in the group of storage elements 107 may be a memory cell of a multi-level cell (MLC) memory.

Figure 2:
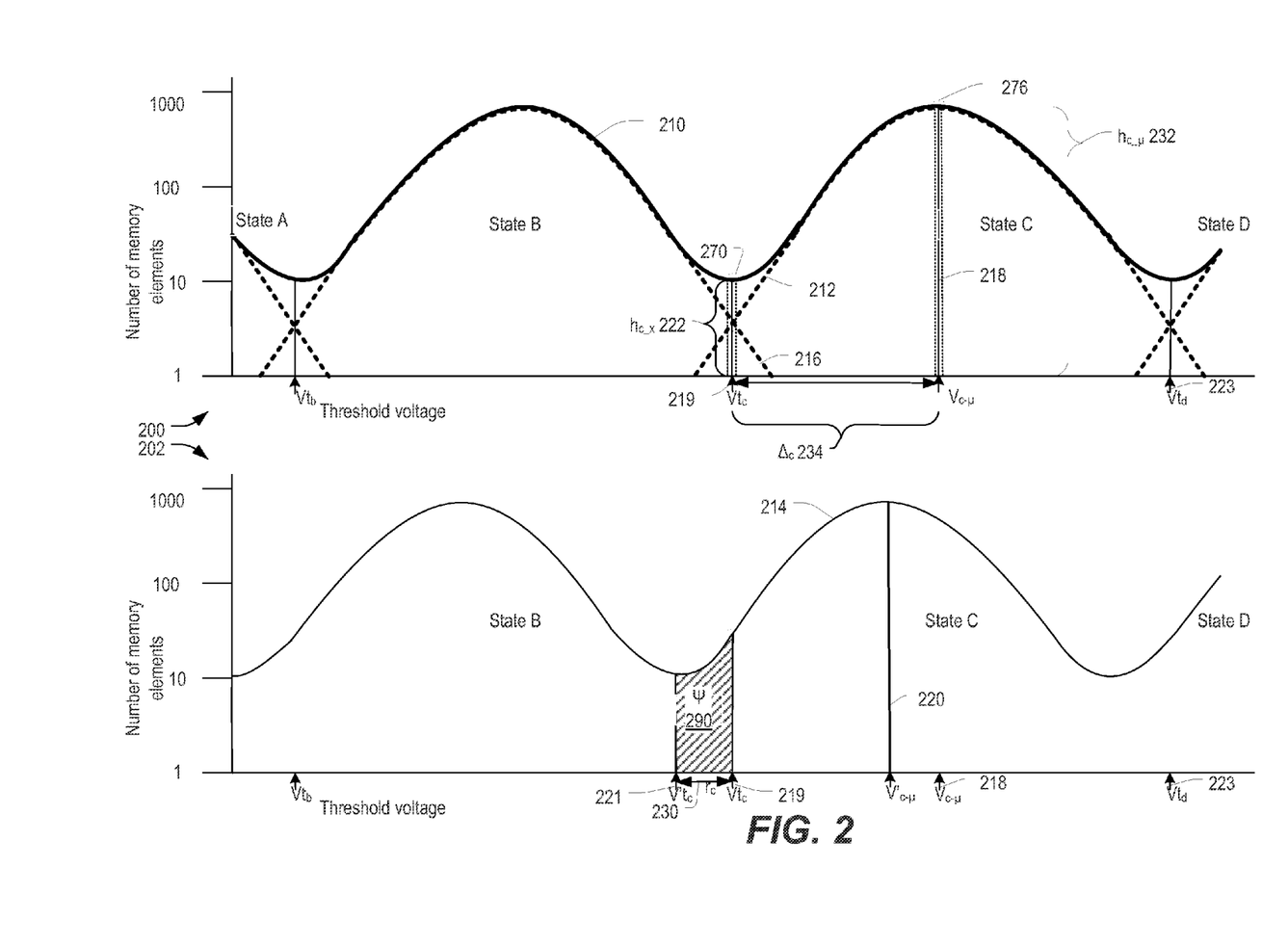
FIG. 2 depicts an illustrative embodiment of a first histogram graph prior to data retention and a second histogram graph depicting a shift of threshold voltages of data storage elements.

Each storage element may have an associated threshold voltage corresponding to a state of the storage element. Each state may correspond to a particular range of threshold voltage values, such as illustrated in FIG. 2.

The state of each storage element represents data stored at the storage element, such as according to a mapping of bits to states of the storage element. The data stored at the storage element may be read by sensing the state of the storage element. For example, a state of a storage element may be read by applying one or more reference voltages of a set of reference voltages to the storage element to compare a threshold voltage of the storage element to the applied reference voltage(s). Each reference voltage can correspond to a border between adjacent states. To illustrate, a reference voltage $Vt_b$ may represent a voltage at a border between state A and state B. A set of the reference voltages ($Vt_a$, $Vt_b$, ... $Vt_g$) may be stored in a portion 116 of the memory 106 and used to sense data stored in the storage elements.

The controller 108 may include an error correction code (ECC) engine 110. The ECC engine 110 may include an ECC encoder 112 and an ECC decoder 114. The ECC encoder 112 may be configured to encode data with error correction information, such as by generating parity bits corresponding to the data and combining the parity bits with the data to form an ECC codeword. The ECC decoder 114 may be configured to decode a representation of a codeword that is read from the memory 106 and correct errors in the data, up to an error correction capability of the ECC decoder 114.

The controller 108 includes a reference voltage update engine 118. Due to data retention effects over time, threshold voltages of the storage elements in the memory 106 may shift, resulting in errors when storage elements programmed to a particular state are later sensed as being in another state. The reference voltage update engine 118 may be configured to determine updated reference voltages that enable reading of the stored data with a lower read error count as compared to reading the stored data using the non-updated reference voltages. For example, the reference voltage update engine 118 may include hardware logic, a processor configured to execute instructions, or a combination thereof, to determine threshold voltage shifts of storage elements in the memory 106 and to generate updated reference voltages based on the determined threshold voltage shifts, such as described in further detail with respect to FIG. 2.

For example, the reference voltage update engine 118 may be configured to generate the updated reference voltages based on a first count of storage elements of the group of storage elements 107 that have a first activation status when sensed with a first reference voltage at a first time and based on a second count of storage elements of the group that have the first activation status when sensed with the first reference voltage at a second time.

The first count may be determined at a first time ($T_1$) when effects of data retention are expected to not result in errors to the stored data. For example, the first count may be determined upon storing data to the storage elements, or soon after storing the data. The first count may be stored in the non-volatile memory to be used during a later reference voltage update operation. The second count of storage elements may be performed at a later time ($T_2$) after the first time ($T_1$), when effects of data retention may have caused errors to occur in the stored data.

The reference voltage update engine 118 may be configured to generate the updated reference voltages based on a difference between the first count and the second count. For example, as described in further detail with respect to FIG. 2, a difference between the first count and the second count may be used to estimate an amount shifting that has occurred to a cell voltage distribution (CVD) curve corresponding to threshold voltages of the storage elements between the first time and the second time. An estimated shift of the CVD curve may be determined based on the first count, the second count, and one or more curve parameters and may be applied as an offset to a corresponding reference voltage to generate one or more updated reference voltages.

During operation, the controller 108 may be configured to determine, at a first time $T_1$ (e.g., an initial time), counts of storage elements having threshold voltages within specified ranges corresponding to reference voltages. For example, in a three bit per cell (3 BPC) implementation, the controller 108 may write data to the group of storage elements 107 by programming each storage element to one of eight distinct states: Erase, A, B, C, D, E, F, and G. A set of reference voltages $Vt_a$, $Vt_b$, $Vt_c$, $Vt_d$, $Vt_e$, $Vt_f$, and $Vt_g$ defines boundaries between the states. Upon writing data to the group of storage elements 107, the controller 108 may measure how many of the storage elements have a threshold voltage within specified voltage ranges corresponding to the reference voltages. For example, the controller 108 may determine how many storage elements have threshold voltages between $Vt_a$ and $Vt_a+\Delta V$, how many storage elements have threshold voltages between $Vt_b$ and $Vt_b+\Delta V$, etc. The controller 108 may also determine counts of storage elements that have a particular activation state (e.g., counts of storage elements that are activated, or counts of storage elements that are not activated) when the storage elements are sensed with each of the reference voltages. For example, the controller 108 may determine a count of storage elements that are activated when sensed with the reference voltage $Vt_a$, a count of storage elements that are activated when sensed with the reference voltage $Vt_b$, etc. The controller 108 may store the measurement data and the counts in the memory 106 for later retrieval and use by the threshold voltage update engine 118.

The controller 108 may monitor memory operations to determine when a triggering event occurs. For example, the triggering event may be associated with a particular number of program erase cycles, a preset elapsed time from the first time (e.g., based on clock data received from the host device 102), a count of read errors, or another triggering event. For example, as described in further detail with respect to FIG. 5, the controller 108 may monitor and at least partially correct for threshold voltage shifting due to program/erase cycling (in response to a triggering event corresponding to program/erase cycling) and read disturbs (in response to a triggering event corresponding to read disturbs) as part of an ongoing process. The first counts of the storage elements that have the activation status at each of the reference voltages (e.g., the first count of storage elements that are activated when sensed with the reference voltage $Vt_a$, the first count of storage elements that are activated when sensed with the reference voltage $Vt_b$, etc.) and/or other parameters may be updated in response to one or more triggering events. For example, the first counts may be updated in response to every write operation to the group of storage elements 107, or in response to selected write operations to the group of storage elements 107, such as periodically (e.g., after every N write operations, where N is an integer greater than 1) and/or aperiodically (e.g., after a write operation following an indication that a number of read errors of data stored in the group of storage elements has exceeded a threshold but has not exceeded an error correction capacity of the ECC decoder 114). As another example, the first counts may be updated in response to one or more of the reference voltages being updated, such as when the reference voltages are re-trained in response to a count of write/erase cycles exceeding a threshold value. Updating the first counts may reset the first time ($T_1$) to indicate the most recent update of the first counts.

In response to determining that a triggering event related to data retention has occurred, at a time $T_2$, the reference voltage update engine 118 may cause the group of storage elements 107 to be sensed to determine second counts of the storage elements that have the activation status at each of the reference voltages (e.g., a second count of storage elements that are activated when sensed with the reference voltage $Vt_a$, a second count of storage elements that are activated when sensed with the reference voltage $Vt_b$, etc.). An example of a triggering event related to data retention is an indication that a total read error count of data read from the group of storage elements 107 exceeds an error correction capacity of the ECC engine 110 even after monitoring and correcting for program/ erase cycling and read disturb effects. Based on the first counts, the second counts, and one or more other parameter values, the threshold voltage update engine 118 may determine shift values for each of the reference voltages and may update the reference voltages based on the determined shift values.

After determining the updated reference voltages, the controller 108 may use the updated reference voltages to read data from the group of storage elements 107. The updated reference voltages result in fewer errors in the data by at least partially compensating for threshold voltage shifts of storage elements due to data retention. As a result, data that was unrecoverable by the ECC engine 110 due to too many errors when read using the non-updated reference voltages may be successfully decoded when read using the updated reference voltages. The updated reference voltages may be stored to the portion 116 of the memory 106 to be used in future reads of the group of storage elements 107.

An updated set of reference voltages may result in reduced errors associated with read data as compared to using reference voltages that are not updated based on threshold voltage shifts of storage elements. Reduced errors may result in a longer useful life of the data storage device 104. Additionally, the reduction in errors due to use of the updated set of reference voltages in reading the stored data may result in reduced processing at the ECC decoder 114, which may result in reduced read latency experienced by the host device 102.

FIG. 2 illustrates an example of updating a reference voltage that may be performed by the reference voltage update engine 118 of FIG. 1. A first graph 200 illustrates a portion of a first histogram 210 (depicted as a smooth curve approximating histogram bin heights for simplicity of illustration) showing a distribution of threshold voltages of storage elements of the group of storage elements 107 of FIG. 1. The first histogram 210 may be modeled as a sum of partially overlapping curves representing storage elements programmed to particular states. The curves may be approximated by a set of Gaussian functions. Each Gaussian function may represent a threshold voltage distribution of cells programmed to a particular state and may have the form of equation (1), where $\sigma$ is a standard deviation, $\mu$ is a mean voltage, and $f(x)$ indicates a probability (or count) of cells having threshold voltage x.

$$f(x) = \frac{1}{\sigma \cdot \sqrt{2\pi}} \cdot e^{-\frac{(x-\mu)^2}{2\sigma^2}} \quad \text{Equation (1)}$$

For example, a first Gaussian curve 212 represents a cell voltage distribution (CVD) of state C at a first time $T_1$ and a second Gaussian curve 216 represents a CVD of state B at the first time $T_1$. The sum of the CVDs at the first time $T_1$ (i.e., the first histogram 210) has multiple local maxima and has a local minimum at a crossover point of the curves 212 and 216 (i.e., at a voltage $Vt_c$ 219 where the CVD of state B intersects the CVD of state C). The local minimum at $Vt_c$ 219 represents an optimal read threshold at the first time $T_1$. Although FIG. 2 illustrates the portion of the first histogram 210 corresponding to state B and state C and portions of state A and state D, it should be understood that non-illustrated portions of the first histogram 210 correspond to the erase state (to the left of state A) and one or more higher-voltage states to the right of state D (e.g., states E, F, and G, in a three bit per cell implementation).

A second graph 202 illustrates a portion of a second histogram 214 that represents threshold voltages of the storage elements at a later time $T_2$ after shifting due to data retention effects. As shown in FIG. 2, the second histogram 214 is shifted left (i.e., in the direction of lower voltages) relative to the first histogram 210. The shift amount is denoted as $r_c$ 230 and is described in further detail below. The second histogram 214 has a shifted local minimum $V'_{t_c}$ 221 that represents a shifted read threshold, as described in further detail below.

Threshold voltages of storage elements in the memory 106 may shift due to the effects of cycling, program disturb, read disturb and data retention. Because program, erase, and read operations occur when the data storage device 104 is powered on, the controller 108 can keep track of a number of program/erase cycles and a number of reads, which may allow error correction, such as diagnosis and repair, to be performed for cycling, program disturb, and read disturb errors. Repair actions can include moving data to a new page or to a new block of the memory 106 in case of program disturb and read disturb errors. Alternatively or in addition, a repair action can include finding a new threshold voltage in case of cycling errors.

However, threshold voltage shifting that results in data retention errors can occur when the data storage device 104 is powered on and also when the data storage device 104 is powered off. If the data storage device 104 remains in a power off state for too long a period of time, accumulated data retention errors in a page of the memory 106 may become uncorrectable before they are diagnosed.

Data retention can occur at any cycle count (e.g., in a device with a low count of write/erase cycles or in an older device with a higher count of write/erase cycles). An adaptive read technique may be used to estimate an optimal or near-optimal movement of read points (i.e., reference voltages representing intersections of CVDs of adjacent states) due to data retention once effects due to cycling are accounted for. In illustrating such an adaptive read technique, a page or word line that undergoes an unknown amount of retention is estimated as having read threshold voltages prior to the occurrence of the retention. For illustrative purposes, the first histogram 210 corresponds to the group of storage elements 107 of FIG. 1 as cells of a 3 bit per cell (3 BPC) multi-level-cell (MLC) NAND flash memory, and "optimal" read threshold voltages Vt (i.e., read threshold voltages at intersections of CVDs after correcting for program disturb, read disturb, and cycling effects) are denoted in equation (2) below. However, the technique may be applied to other types of memory, such as a single level cell (SLC) memory, a 2 BPC MLC memory, a 4 BPC MLC memory, or a different number of bits per cell.

In a 3 BPC implementation, each storage element of the group of storage elements 107 may be programmed into one of eight states, designated as an Erase state, state A, state B, state C, state D, state E, state F, and state G. Optimal read voltages Vt occur at crossover points between the CVDs of each of the states, denoted as:

$$Vt = \{Vt_a, Vt_b, Vt_c, Vt_d, Vt_e, Vt_f, Vt_g\} \quad \text{Equation (2):}$$

where $Vt_a$ represents a voltage where the CVD of the Erase state intersects the CVD of state A, $Vt_b$ represents a voltage where the CVD of state A intersects the CVD of state B, $Vt_c$ represents a voltage where the CVD of state B intersects the CVD of state C, etc.

An adaptive read technique that may be applied by the reference voltage update engine 118 of FIG. 1 is explained with reference to the threshold voltage $Vt_c$ 219. While the adaptive read technique is explained with reference to the threshold voltage $Vt_c$ 219, similar calculations and assumptions apply to other read thresholds (e.g., $Vt_a$, $Vt_b$, $Vt_d$, $Vt_e$, $Vt_f$, and $Vt_g$, in a 3 BPC implementation). Although FIG. 2 illustrates the CVD of state B (i.e., the second Gaussian curve 216) and the CVD of state C (i.e., the first Gaussian curve 212), the adaptive read technique does not require the CVDs to be obtained. Instead, the following values may be obtained by the reference voltage update engine 118 at the time $T_1$, prior to occurrence of threshold voltage shifting of storage elements in the group of storage element 107 due to data retention:

$h_{c\_\mu}$ 232: The height of a bin 276 (e.g., a unit width bin of the first histogram 210) at the mean of the first Gaussian curve 212, corresponding to state C; and $h_{c\_x}$ 222: The height of a bin 270 (e.g., a unit width bin of the first histogram 210) at the cross-over of the second Gaussian curve 216 corresponding to state B and the first Gaussian curve 212 corresponding to state C at time $T_1$ (i.e., at the threshold voltage $Vt_c$ 219).

As explained below, measuring $h_{c\_\mu}$ 232 and $h_{c\_x}$ 222 enables parameters of the CVD of state C to be estimated according to an analytic formula that models the CVD for state C, such as parameters of a Gaussian distribution. In addition, at the time $T_1$, a count $A_c$ of the number of storage elements of the group that have a particular activation status (e.g., that are activated, or that are not activated) when sensed with the threshold voltage $Vt_c$ 219 may be determined. In the first graph 200, A can be represented by the area under the curve 210 to the left of threshold voltage $Vt_c$ 219.

For each unit width bin of the first histogram 210, a height of the bin represents the incremental increase in the number of active storage elements when the threshold voltage is incrementally increased. To illustrate, if a first count Y of storage elements (e.g., flash memory cells) are active when the storage elements are sensed with a first voltage V1 and a second count Z of storage elements are active when the storage elements are sensed with a second voltage V2, a height of a bin of the first histogram 210 that spans from V1 to V2 corresponds to Z-Y. A width of each bin of the first histogram 210 may be associated with a smallest voltage increment that can be applied by the controller 108 of FIG. 1. For example, a bin width may correspond to a few millivolts (mV); e.g., 1 unit=X mV, where X may be a parameter that may vary from application to application and/or from technology to technology.

When the group of storage elements 107 has recently been programmed, $h_{c\_x}$ 222 can be obtained at the cross-over of state B and state C. In an implementation where $Vt_c$ 219 is at a boundary between adjacent bins (rather than within the bin 270 as illustrated in FIG. 2), $h_{c\_x}$ 222 may be selected as the less-populated bin (i.e., lower height) of the two adjacent bins that border $Vt_c$ 219, as provided in equation (3).

$$h_{c\_x} = \min(\text{bin}(V_{t_c}^-, V_{t_c}), \text{bin}(V_{t_c}, V_{t_c}^+)) \quad \text{Equation (3):}$$

In equation (3), $\text{bin}(V_{t_c}^-, V_{t_c})$ represents the height of the bin of the first histogram 210 that has its right border at $Vt_c$, $\text{bin}(V_{t_c}, V_{t_c}^+)$ represents the height of the bin of the first histogram 210 that has its left border at $Vt_c$, and min (X, Y) represents a function that selects the lesser of two values X and Y.

Without generating the first histogram 210, the voltage corresponding to the mean of the first Gaussian curve 212 (i.e., a voltage corresponding to the peak of the first Gaussian curve 212) may be unknown by the read voltage update engine 118. However, a first order approximation of the height $h_{c\_\mu}$ 232 of the first Gaussian curve 212 can be determined at a voltage $h_{c\_\mu}$ 218 that is midway between the boundaries of state C (i.e., halfway between $V_{t_c}$ 219 and $V_{t_d}$ 223), according to Equations (4) and (5).

$$V_{c\_\mu} = \frac{V_{t_c} + V_{t_d}}{2} \quad \text{Equation (4)}$$

$$h_{c\_\mu} = \max(\text{bin}(V_{t_{c\_\mu}}^-, V_{t_{c\_\mu}}), \text{bin}(V_{t_{c\_\mu}}, V_{t_{c\_\mu}}^+)) \quad \text{Equation (5)}$$

Also, a difference in $V_{c\_\mu}$ 218 and $V_{t_c}$ 219 may be denoted by $\Delta c$ 234, according to Equation (6).

$$\Delta_c = V_{c\_\mu} - V_{t_c} \quad \text{Equation (6):}$$

Because $V_{c\_\mu}$ 218 approximates the mean of the first Gaussian curve 212, $h_{c\_x}$ 222 can be written in terms of $\sigma_c$ (the standard deviation for the first Gaussian curve 212 for state C) using equation (1), as denoted in equation (7).

$$\frac{h_{c\_x}}{2} = h_{c\_\mu} \cdot e^{-\frac{\Delta_c^2}{2\sigma_c^2}} \quad \text{Equation (7)}$$

It should be noted that, at $Vt_c$ 219, the height of the first histogram 210 ($h_{c\_x}$ 222) is the sum of equal contributions $$\frac{h_{c\_x}}{2}$$

from state C and from state ti, so that $$\frac{h_{c\_x}}{2}$$

of Equation (7) is the contribution from state C and the other $$\frac{h_{c\_x}}{2}$$

is contributed by state B.

The only unknown in equation (7) is $\sigma_c$, which can be written as $$\sigma_c = \sqrt{\frac{\Delta_c^2}{2 \cdot \ln\frac{2 \cdot h_{c\_\mu}}{h_{c\_x}}}} \quad \text{Equation (8)}$$

As explained above, retention causes the optimal read thresholds to move by an unknown amount. If the amount of retention exceeds a certain amount and the thresholds are not adjusted to account for the retention, the data read from the memory 106 may become uncorrectable. The unidentified optimal thresholds (the cross-over Vt values) after retention may be denoted by $V'_t$.

$$V'_t = \{V'_{t_a}, V'_{t_b}, V'_{t_c}, V'_{t_d}, V'_{t_e}, V'_{t_f}, V'_{t_g}\} \quad \text{Equation (9):}$$

A voltage shift to adjust $Vt_c$ 219 to obtain $V'_{t_c}$ 221 is illustrated in the second graph 202 and denoted as $r_c$ 230.

$$r_c = V'_{t_c} - V_{t_c} \quad \text{Equation (10):}$$

$V'_{c\_\mu}$ 220 is the voltage representing the shifted mean for state C at time $T_2$.

As a result of the voltage shift illustrated by the second histogram 214, when the group of storage elements are again sensed using $Vt_c$ 219, a post-retention count $A'_c$ of storage elements that are activated is larger than the pre-retention count $A_c$. The difference $\Psi$ 290 between the second count $A'_c$ and the first count $A_c$ is graphically depicted as the area of a hatched region under the curve representing the second histogram 214 and extending from $V'_{t_c}$ 221 to $Vt_c$ 219. The shift value $r_c$ may therefore be determined based on Equation (10) according to the relationship expressed in Equation (11).

$$\Psi = A'_c - A_c \cong \int_{\Delta_c + r_c}^{\Delta_c} dv \cdot h_{c\_\mu} \cdot e^{-\frac{v^2}{2 \cdot \sigma_c^2}} \quad \text{Equation (11)}$$

The integral of Equation (11) is an approximation to $\Psi$ 290 that ignores the contribution of storage elements of state B for computational efficiency. However, the contribution of storage elements of state B diminishes, and a corresponding accuracy of the approximation of Equation (11) increases, as the magnitude of $r_c$ 230 increases. In alternative implementations, the contribution of state B to $\Psi$ 290 may be included for increased accuracy. Equation (11) may be used to determine a value of $r_c$ 230 according to various techniques. An example of an efficient method to determine an approximate value of $r_c$ 230 is described in further detail with respect to FIG. 5.

An approximation of the shift amount $r_c$ 230 due to data retention may therefore be based on three measurements made at time $T_1$ (e.g., prior to errors occurring to stored data due to data retention) and one measurement at time $T_2$ after data retention. The three measurements made at time $T_1$ are measurements of the bin height at $Vt_c$ 219 ($h_{c\_x}$ 222), the bin height at the estimated peak $V_{c-\mu}$ 218 ($h_{c\_\mu}$ 232) (used to determine $\sigma_c$, per Equation (8)), and the count $A_c$ of the number of storage elements of the group that have a particular activation status when sensed with the threshold voltage $Vt_c$ 219. The measurement made at time $T_2$ is the count $A'_c$ of the number of storage elements of the group that have the particular activation status when sensed with the threshold voltage $Vt_c$ 219 at time $T_2$. As a result, a relatively small amount of measurement data may be stored upon programming data to the memory 106, such as a peak height (e.g., the bin height at the estimated peak $V_{c-\mu}$ 218 of the first histogram 210) and a crossover height (e.g., the bin height at $Vt_c$ 219 of the first histogram 210) and the count $A_t$ for each state (Erase, A, B, C, D, E, F, and G) after programming data to a block of a flash memory. The measurement data may be retrieved upon occurrence of a triggering event and used in accordance with corresponding values of $A'_t$ to determine a shift of each state to generate updated reference voltages after data retention.

Determining updated reference voltages (e.g., the updated reference voltages $Vt'_a$, $Vt'_b$, ... $Vt'_g$ from histogram parameters) may result in reduced calculation time as compared with other methods, such as methods that would measure and analyze the entire second histogram 214 to locate local minima. The reduced calculation time results in reduced read latency experienced by the host device 102.

Figure 3:
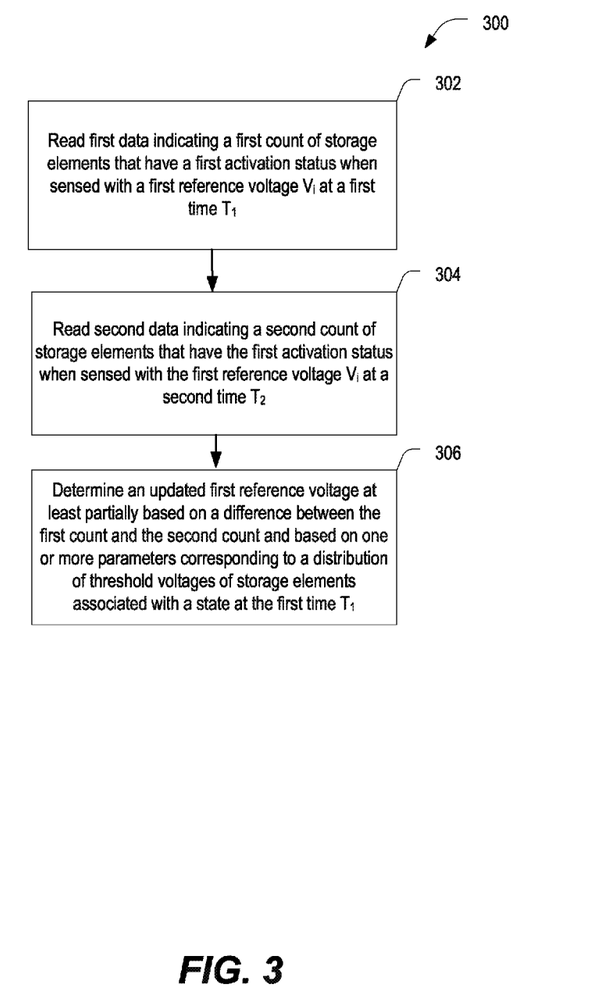
FIG. 3 is a flow diagram illustrating a particular embodiment of a method of updating reference voltages.

Referring to FIG. 3, a flowchart of an illustrative embodiment of a method 300 of updating reference voltages based on parameters of a threshold voltage histogram is illustrated. The method 300 may be performed in a data storage device that includes a non-volatile memory that includes a group of storage elements that are programmable to a state of a set of states. The state may correspond to a range of threshold voltage values, such as in an implementation of a MLC flash memory device. For example, the method 300 may be performed by the data storage device 104 of FIG. 1.

The method 300 may include reading first data from a group of storage elements of the non-volatile memory, at 302. The first data indicates a first count of storage elements that have a first activation status when sensed with a first reference voltage at a first time $T_1$. For example, the first count may correspond to $A_c$ and may indicate a number of storage elements of the group of storage elements 107 of FIG. 1 that are activated when the reference voltage $Vt_c$ 219 of FIG. 2 is used to sense the group of storage elements 107 prior to threshold voltage shifting due to data retention (e.g., corresponding to the first graph 200 of FIG. 2). For example, the first count may be determined immediately or soon after storing data to the storage elements and prior to data retention effects causing errors to occur in the stored data.

The first count and/or other parameters may be updated in response to one or more events. For example, $A_c$, $h_{c\_\mu}$ 232, and $\Delta_c$ 234 of FIG. 2 may be updated in response to every write operation to the group of storage elements 107, or in response to selected write operations to the group of storage elements 107, such as periodically (e.g., after every N write operations, where N is an integer greater than 1) and/or aperiodically (e.g., after a write operation following an indication that a number of read errors of data stored in the storage elements has exceeded a threshold but has not exceeded an ECC correction capability). As another example, $A_c$, $h_{c\_\mu}$ 232, and $\Delta_c$ 234 of FIG. 2 may be updated in response to one or more of the reference voltages being updated, such as when the reference voltages are re-trained in response to a count of write/erase cycles exceeding a threshold value. Updating the first count may reset the first time ($T_1$) to indicate the most recent update of the first count.

The method 300 includes reading second data from the non-volatile memory at a second time $T_2$, at 304. The second data indicates a second count of storage elements that have the first activation status when sensed with the first reference voltage at the second time $T_2$. For example, the second count may correspond to $A_c$ and may indicate a number of storage elements of the group of storage elements 107 of FIG. 1 that are activated when the reference voltage $Vt_c$ 219 of FIG. 2 is used to sense the group of storage elements 107 after threshold voltage shifting due to data retention (e.g., corresponding to the second graph 202 of FIG. 2).

An updated first reference voltage is determined at least partially based on a difference between the first count and the second count and based on one or more parameters corresponding to a distribution of threshold voltages of storage elements associated with the state at the first time, at 306. Calculating the updated first reference voltage may correspond to determining a shift (e.g., $r_c$ 230) of the distribution of threshold voltages and determining the updated first reference voltage by applying the shift to the first reference voltage. Multiple updated reference voltages may be determined corresponding to a plurality of reference voltages (e.g., $V_t$ of Equation (2)). The multiple updated reference voltages may include the updated first reference voltage (e.g., $V'_{t_c}$ 221 of FIG. 2).

In some implementations, the first data may be read during a first measurement operation at the first time $T_1$ (e.g., the first time $T_1$ may be immediately or soon after storing data to the storage elements and prior to data retention effects causing errors to occur in the stored data). The first measurement operation may further include determining a first number of storage elements of the group that have a threshold voltage within a first voltage range corresponding to the first reference voltage (e.g., determining $h_{c\_x}$ 222 of FIG. 2). For example, the first number may be determined for the first reference voltage (e.g., $Vt_c$) by sensing the storage elements using a first voltage (e.g., $Vt_c$) and a second voltage (e.g., $Vt_c+\Delta V$). The first number corresponds to the difference in the number of storage elements that are activated when sensed using the first voltage as compared to using the second voltage. The first measurement operation may also include determining a second number of storage elements of the group that have a threshold voltage within a second voltage range corresponding to a central region of the range of threshold voltages (e.g., determining $h_{c\_\mu}$ 232 of FIG. 2). The one or more parameters may be determined at least partially based on the first number and the second number. To illustrate, a standard deviation $\sigma_c$ of a Gaussian distribution corresponding to state C may be determined according to Equation (8) based on $h_{c\_x}$ 222 and based on $h_{c\_\mu}$ 232 of FIG. 2. As another example, the one or more parameters may include a height of a peak of the Gaussian distribution, such as 232 of FIG. 2.

The second time $T_2$ may be associated with an indication that an error count associated with reading data from the group of storage elements exceeds an error correction capability of an error correction code (ECC) engine. For example, the second time $T_2$ may be determined in response to the ECC engine 110 of FIG. 1 indicating uncorrectable errors in data read from the group of storage elements 107. As another example, the second time $T_2$ may be determined according to detecting a triggering event that is associated with a preset elapsed time from the first time (e.g., based on clock data received from the host device 102), a count of read errors, or another triggering event.

Figure 5:
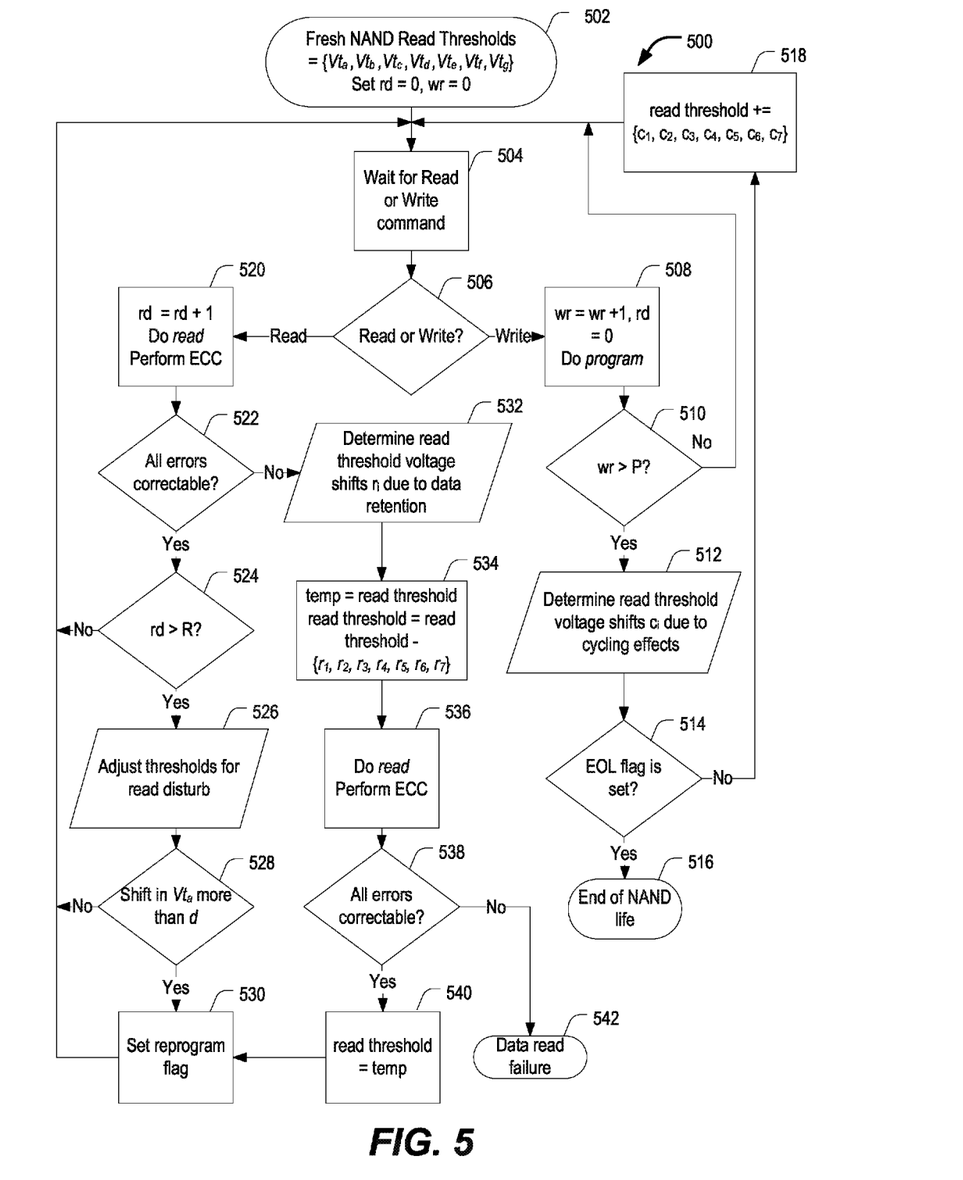
FIG. 5 is a flow diagram illustrating another particular embodiment of a method of updating reference voltages.

Prior to determining the second count, the first reference voltage may be adjusted for cycle count, program disturb, and read disturb effects associated with the group of storage elements, such as described in further detail with respect to FIG. 5.

Determining updated reference voltages from histogram parameters based on an estimated mean or average shift of threshold voltages of storage elements originally programmed to a particular state may result in reduced calculation time as compared with other calculation methods. Generating updated reference voltages with reduced calculation time as compared to other methods may result in reduced read latency of a device accessing the memory, such as the host device 102.

Figure 4:
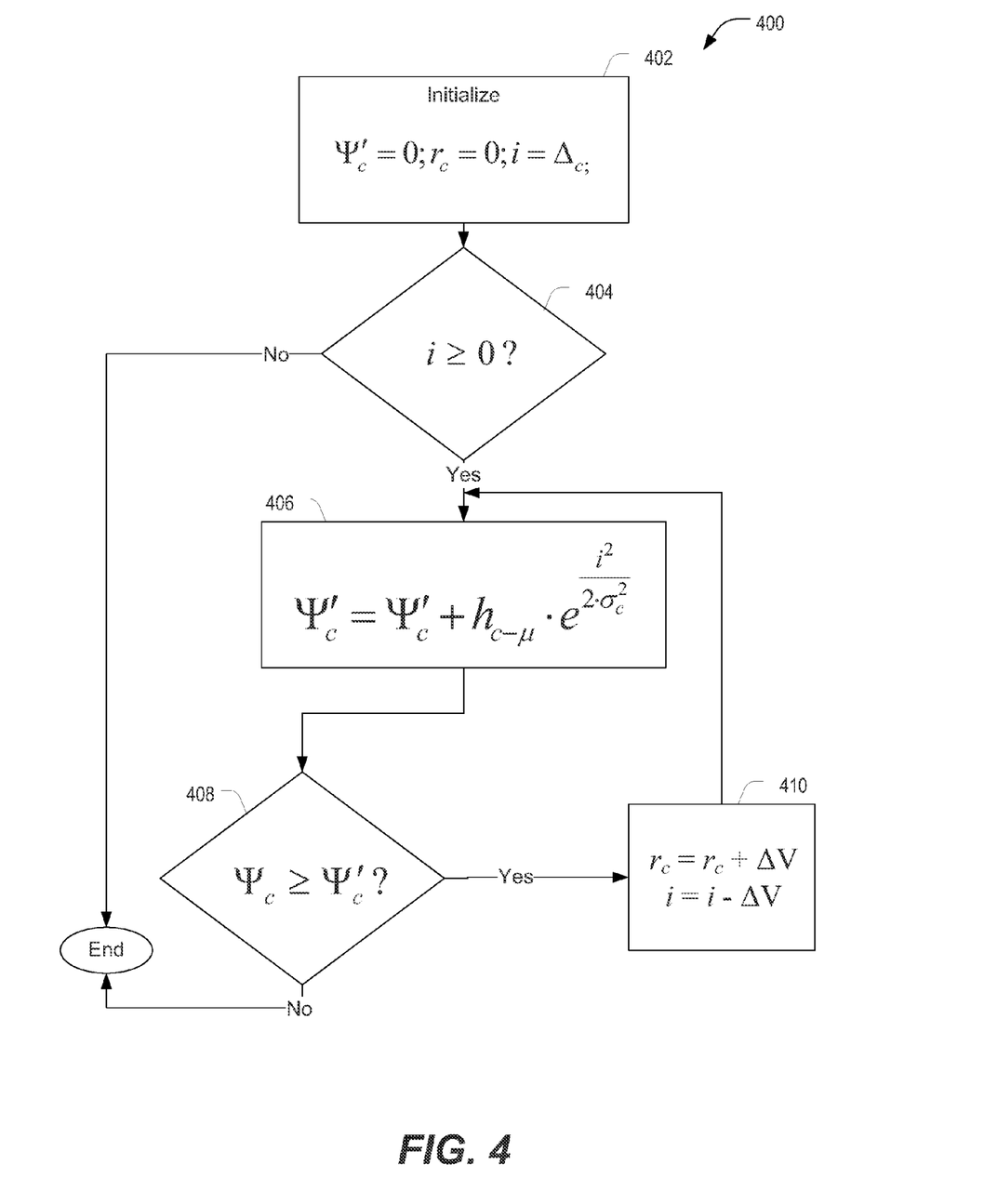
FIG. 4 is a flow diagram of an iterative process to determine a shift amount of a distribution of threshold voltages based on a change in a count of storage elements that are activated when sensed with a reference voltage at a first time as compared to when sensed with the reference voltage at a later time after data retention.

Referring to FIG. 4, a flowchart depicts an example of an iterative process 400 to determine a shift amount of a distribution of threshold voltages based on a change in a count of storage elements that are activated when sensed with a reference voltage at a first time as compared to when sensed with the reference voltage at a later time after data retention. For example, the process 400 is illustrated as being performed by the data storage device 104 of FIG. 1 to estimate a value of $r_c$ 230 of FIG. 2 based on parameters of the first Gaussian distribution 212 and based on the count $A'_c$ (the number of storage elements of the group 107 that have the particular activation status when sensed with the reference voltage $Vt_c$ 219 at time $T_2$) and the count $A_c$ (the number of storage elements of the group that have a particular activation status when sensed with the reference voltage $Vt_c$ 219 at time $T_1$). However, the process 400 may be performed for any or all of the states of storage elements such as for one or more of states Er-C in a 2 BPC implementation, one or more of states Er-G in a 3 BPC implementation, etc.

Generating an updated reference voltage (e.g., $V'_{t_c}$ 221 of FIG. 2) using the process 400 may include estimating a shift amount (e.g., $r_c$ 230) so that a portion of the first Gaussian distribution (e.g., the first Gaussian distribution 212) between the first reference voltage (e.g., $Vt_c$) and a second voltage corresponds to the difference between the first count and the second count ($A'_c-A_c$, denoted as $\psi_c$). The second voltage corresponds to the reference voltage $Vt_c$ 219 offset by the shift amount (e.g., offset by $r_c$ 230).

Estimating the shift amount (e.g., $r_c$ 230) includes incrementally increasing a trial value of the second voltage and determining a size of a trial portion of the Gaussian distribution between the first reference voltage and the trial value of the second voltage. The process 400 approximates the integral of Equation (11) by iteratively increasing a portion of the Gaussian distribution, starting at a distance from the mean corresponding to $\Delta_c$ 234, until accumulated area of a portion of the Gaussian distribution approximately equals $\psi_c$.

Variables are initialized to starting values, at 402. A variable $\psi'$ represents a size of a trial portion of the first Gaussian distribution 212 of FIG. 2 and is initialized to a 0 value. A variable $r_c$ represents a trial value of a magnitude of the shift amount $r_c$ 230 and is initialized to a 0 value. A variable i represents a trial version of the second voltage that is initialized to $\Delta_c$ 234.

A determination is made whether i is greater than or equal to 0, at 404. When i is less than 0, the shift amount $r_c$ is determined to exceed the distance $A_c$ 234 and the process may terminate. Otherwise, a value of $\psi'$ is increased by an amount corresponding to a height of the Gaussian distribution at i:

$$\Psi'_c = \Psi'_c + h_{c-\mu} \cdot e^{\frac{i^2}{2\sigma_c^2}} \qquad \text{Equation (12)}$$

A determination is made whether $\psi$c is greater than or equal to $\psi'$c, at 408. In response to $\psi$c being greater than or equal to $\psi'$c, $r_c$ is increased by an amount $\Delta V$ that corresponds to a voltage step size, and i is reduced by the amount $\Delta V$, at 410. Processing continues with a next iteration using the updated value of i, at 406. Otherwise, when $\psi$c is less than $\psi'$c at 408, the size of the trial portion $\psi'$c corresponds to a number of storage elements that equals or exceeds the difference between the first count and the second count (i.e., $\psi'c \geq A'_c - A_c$) and the process 400 may end. The value of the variable $r_c$ (equal to $\Delta_c - i$) may be used as the estimated shift amount $r_c$ 230.

Referring to FIG. 5, a flowchart of a method 500 of updating reference voltages is depicted. The method 500 illustrates an adaptive reference voltage technique that may be applied by the controller 108 of FIG. 1 to correct for threshold voltage shifts due to multiple causes of threshold voltage disturbances that may be experienced by the memory 106 in a MLC NAND flash implementation.

The method 500 includes initialing a set of read voltages $Vt_a, Vt_b, \ldots Vt_g$ to values corresponding to a "fresh" memory that has a relatively low count of write/erase (W/E) cycles, at 502. A count 'rd' of read operations and a count 'wr' of write operations to a particular portion of the memory 106, such as to the group 107 of FIG. 1, are set to zero. Processing continues to 504 and pauses until a read command or a write command is received for the portion of the memory.

In response to receiving a command, such as from the host device 102 of FIG. 1 to access the portion of the memory, a determination is made whether the command corresponds to a read command or to a write command, at 504. In response to the command corresponding to a write command, the count of write operations is incremented by one, the count of read operations is reset to zero, and data is programmed into the portion of the memory, at 508. In addition, at 508, data retention parameters, such as $A_c$, $h_{c\_\mu}$ 232, and $\Delta_c$ 234 as described with respect to FIG. 2, may be stored or updated. To illustrate, data retention parameters may be updated every time data is programmed into the portion of the memory, at specified values of the count of write operations (e.g., every fifth programming operation), or according to one or more other criteria (e.g., when a most recent read operation resulted in a count of correctable errors that exceeded a threshold amount).

A determination is made whether the count of write operations exceeds a programming threshold "P", at 510. In response to the count of write operations not exceeding the threshold P, processing returns to 504. Otherwise, one or more read threshold voltage shifts $c_i$ due to cycling effects are determined, at 512.

A determination is made of whether an end-of-life (EOL) flag is set, at 514. For example, the EOL flag may be set based on the count or write operations exceeding a limit beyond which data cannot be reliably programmed to the memory. In response to the EOL flag being set, a useful life of the memory may end, at 516. Otherwise, the set of read voltages is updated based on the read threshold voltage shifts $c_i$, at 518, and processing returns to 504. In addition, at 518, after updating the set of read voltages, the data retention parameters, such as $A_c$, $h_{c\_\mu}$ 232, and $\Delta_c$ 234 as described with respect to FIG. 2, may be updated.

If the received command corresponds to a read command, at 506, the count of read operations is incremented by one, a representation of the requested data is read from the portion of the memory, and an ECC decoding operation is performed on the representation of the requested data, at 520. A determination is made whether all errors occurring in the representation of the requested data are correctable, at 522. In response to all errors being correctable, a determination is made whether the count of read operations exceeds a reading threshold "R", at 524. In response to the count of read operations not exceeding the reading threshold, processing returns to 504.

If the count of read operations exceeds the reading threshold, the read voltages may be adjusted to test one or more threshold voltage shifts due to read disturb effects, at 526. The count of read operations corresponds to the number of reads to a particular group of storage elements since the last program operation. At every program operation to the particular group of storage elements, the count of read operations is reset to zero (i.e., rd=0 at 508), because the reprogram operation nullifies read disturb effects. The group of storage elements may be page, a word line, or a block, as illustrative examples. To illustrate, a number of read operations performed at a block may be determined and compared to the reading threshold R. Determining that the number of read operations exceeds R may trigger performing read disturb diagnosis for any or all of the pages or word lines in that block.

For example, because read disturb effects may be most pronounced in causing storage elements in the Erase state to transition to state A, the reference voltage $Vt_a$ may be temporarily increased by a disturb threshold "d" and the data may be re-read using the temporary value of $Vt_a$ to determine if a number of errors in the data is reduced using the temporary value of $Vt_a$. If the number of errors in the data is reduced using the temporary value of $Vt_a$, then a determination may be made that a shift in the read voltage $Vt_a$ corresponding to the lowest-voltage state (e.g., the erase state) exceeds the disturb threshold "d", at 528, and a flag may be set to schedule reprogramming of the portion of the memory to erase the disturb effects, at 530, and processing returns to 504. Although read disturb testing and determination at 526 and 528 are described in terms of $Vt_a$, in other embodiments additional read voltages (e.g., $Vt_b$, $Vt_c$, etc.) may be tested for shifting, such as by using one or more additional disturb threshold values to generate temporarily increased or decreased read voltages, at 526 for error comparison(s) at 528. For example, in another particular embodiment, a read disturb signature may include an increase of $Vt_a$ and a decrease of $Vt_g$. Adjustments to each of the read voltages $Vt_a$–$Vt_g$ may be applied according to a read disturb signature, at 526. A read operation using the adjusted thresholds that results in a reduced error count, at 528, may indicate read disturb, and reprogramming may be scheduled by setting the reprogram flag at 530.

If the ECC decoding operation is unable to correct all errors in the representation of the requested data, at 522, read threshold voltage shifts $r_i$ due to data retention may be determined, at 532. For example, the read threshold voltage shifts may be determined according to the method 300 of FIG. 3, such as by using the process 400 of FIG. 4. The determined read threshold voltage shifts may be applied to the read voltages and assigned to a temporary set of read voltages, at 534. The read operation may be performed using the temporary set of read voltages, at 536, and another ECC decoding operation may be performed to decode the representation of the requested data read from the portion of the memory using the temporary set of read voltages.

If all errors in the representation of the requested data are correctable, at 536, the read voltages are updated to the values of the temporary set of read voltages, at 540. Otherwise, a data read failure occurs, at 534.

As illustrated in FIG. 5, read voltages may be updated during operation of the memory to account for cycling effects that may broaden and shift CVDs (i.e., along the path from 508-518) and to account for read disturb effects that may shift threshold values of storage elements in lower states to a higher state (i.e., along the path from 520-530) as an ongoing process. As a result, when a read of data from the memory results in uncorrectable errors, adjustments for data retention effects at 532 may be performed with read voltages that are already substantially adjusted for cycling effects and for read disturb effects. As a result, an accuracy of determining the read threshold voltage shifts $r_i$ may be enhanced as compared to applying the method 400 of FIG. 4 to determine shifts of read voltages that may also be affected by cycling effects and read disturb effects.

Although various components depicted herein are illustrated as block components and described in general terms, such components may include one or more microprocessors, state machines, or other circuits configured to enable a data storage device, such as the data storage device 104 of FIG. 1, to perform the particular functions attributed to such components. For example, the reference voltage update engine 118 of FIG. 1 may represent physical components, such as controllers, processors, state machines, logic circuits, or other structures to create an updated set of reference voltages.

In a particular embodiment, the data storage device 104 may be a portable device configured to be selectively coupled to one or more external devices. For example, the data storage device 104 may be a removable device such as a universal serial bus (USB) flash drive or a removable memory card. However, in other embodiments, the data storage device 104 may be attached or embedded within one or more host devices, such as within a housing of a portable communication device. For example, the data storage device 104 may be within a packaged apparatus, such as a wireless telephone, a personal digital assistant (PDA), a gaming device or console, a portable navigation device, a computer, or other device that uses internal non-volatile memory. In a particular embodiment, the data storage device 104 includes a non-volatile memory, such as a Flash memory (e.g., NAND, NOR, Multi-Level Cell (MLC), Divided bit-line NOR (DINOR), AND, high capacitive coupling ratio (HiCR), asymmetrical contactless transistor (ACT), or other Flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
   in a data storage device that includes a non-volatile memory, the non-volatile memory including a group of storage elements that are programmable to a state of a set of states, the state corresponding to a range of threshold voltage values:
      reading first data from the non-volatile memory, the first data indicating a first count of storage elements of the group that have a first activation status when sensed with a first reference voltage at a first time;
      reading second data from the non-volatile memory, the second data indicating a second count of storage elements of the group that have the first activation status when sensed with the first reference voltage at a second time; and
      generating an updated first reference voltage at least partially based on an amount of difference between the first count and the second count and based on one or more parameters corresponding to a distribution of threshold voltages of storage elements associated with the state at the first time.

2. The method of claim 1, wherein the first data is read during a first measurement operation at the first time, wherein the first measurement operation further includes:
   determining a first number of storage elements of the group that have a threshold voltage within a first voltage range corresponding to the first reference voltage; and
   determining a second number of storage elements of the group that have a threshold voltage within a second voltage range corresponding to a central region of the range of threshold voltage values,
   wherein the one or more parameters are determined at least partially based on the first number and the second number.

3. The method of claim 1, wherein the one or more parameters includes a height of a peak of a Gaussian distribution and a standard deviation of the Gaussian distribution.

4. The method of claim 3, wherein generating the updated reference voltage includes estimating a shift amount so that a portion of the Gaussian distribution between the first reference voltage and a second voltage corresponds to the amount of difference between the first count and the second count, wherein the second voltage corresponds to the first reference voltage offset by the shift amount.

5. The method of claim 4, wherein estimating the shift amount includes incrementally increasing a trial value of the second voltage and determining a size of a trial portion of the Gaussian distribution between the first reference voltage and the trial value of the second voltage.

6. The method of claim 5, further comprising, in response to determining that the size of the trial portion corresponds to a number of storage elements that equals or exceeds the amount of difference between the first count and the second count, determining the shift amount based on the trial value of the second voltage.

7. The method of claim 1, wherein the second time is associated with an indication that an error count associated with reading data from the group of storage elements exceeds an error correction capability of an error correction code (ECC) engine.

8. The method of claim 1, wherein prior to determining the second count, the first reference voltage is adjusted for cycle count, program disturb, and read disturb effects associated with the group of storage elements.

9. The method of claim 1, wherein generating the updated first reference voltage includes determining a shift of the distribution of threshold voltages and determining the updated first reference voltage by applying the shift to the first reference voltage.

10. The method of claim 1, wherein stored data is read from the group of storage elements using a plurality of reference voltages including the first reference voltage, and further comprising determining multiple updated reference voltages corresponding to the plurality of reference voltages, the multiple updated reference voltages including the updated first reference voltage.

11. The method of claim 1, further comprising updating the first data in response to a predetermined number of write operations being performed to the group of storage elements.

12. The method of claim 1, further comprising updating the first data in response to a write operation being performed to the group of storage elements, the write operation responsive to an indication that a number of read errors has exceeded an error threshold.

13. The method of claim 1, further comprising updating the first data in response to an update of one or more reference voltages, the update responsive to a count of write/erase cycles exceeding a write/erase threshold.

14. A data storage device comprising:
   a non-volatile memory including a group of storage elements that are programmable to a state of a set of states, the state corresponding to a range of threshold voltage values; and
   a controller configured to:
      read first data from the non-volatile memory, the first data indicating a first count of storage elements of the group that have a first activation status when sensed with a first reference voltage at a first time;
      read second data from the non-volatile memory, the second data indicating a second count of storage elements of the group that have the first activation status when sensed with the first reference voltage at a second time; and
      generate an updated first reference voltage at least partially based on an amount of difference between the first count and the second count and based on one or more parameters corresponding to a distribution of threshold voltages of storage elements associated with the state at the first time.

15. The data storage device of claim 14, wherein the controller is configured to read the first data during a first measurement operation at the first time, wherein during the first measurement operation the controller is further configured to:
   determine a first number of storage elements of the group that have a threshold voltage within a first voltage range corresponding to the first reference voltage; and
   determine a second number of storage elements of the group that have a threshold voltage within a second voltage range corresponding to a central region of the range of threshold voltage values,
   wherein the one or more parameters are determined at least partially based on the first number and the second number.

16. The data storage device of claim 14, wherein the one or more parameters includes a height of a peak of a Gaussian distribution and a standard deviation of the Gaussian distribution.

17. The data storage device of claim 16, wherein the controller is configured to generate the updated reference voltage by estimating a shift amount so that a portion of the Gaussian distribution between the first reference voltage and a second voltage corresponds to the amount of difference between the first count and the second count, wherein the second voltage corresponds to the first reference voltage offset by the shift amount.

18. The data storage device of claim 17, wherein the controller is configured to estimate the shift amount by incrementally increasing a trial value of the second voltage and determining a size of a trial portion of the Gaussian distribution between the first reference voltage and the trial value of the second voltage.

19. The data storage device of claim 18, wherein the controller is further configured, in response to determining that the size of the trial portion corresponds to a number of storage elements that equals or exceeds the amount of difference between the first count and the second count, to determine the shift amount based on the trial value of the second voltage.

20. The data storage device of claim 14, further comprising an error correction code (ECC) engine and wherein the second time is associated with an indication that an error count associated with reading data from the group of storage elements exceeds an error correction capability of the ECC engine.

21. The data storage device of claim 14, wherein the controller is configured to adjust the first reference voltage for cycle count, program disturb, and read disturb effects associated with the group of storage elements prior to determining the second count.

22. The data storage device of claim 14, wherein the controller is configured to determine a shift of the distribution of threshold voltages and to determine the updated first reference voltage by applying the shift to the first reference voltage.

23. The data storage device of claim 14, wherein the controller is configured to read stored data from the group of storage elements using a plurality of reference voltages including the first reference voltage, and to determine multiple updated reference voltages corresponding to the plurality of reference voltages, the multiple updated reference voltages including the updated first reference voltage.

* * * * *